United States Patent [19]

Ogasawara

[11] Patent Number: 4,620,212
[45] Date of Patent: Oct. 28, 1986

[54] SEMICONDUCTOR DEVICE WITH A RESISTOR OF POLYCRYSTALLINE SILICON

[75] Inventor: Kazuo Ogasawara, Tokyo, Japan
[73] Assignee: NEC Corporation, Tokyo, Japan
[21] Appl. No.: 498,030
[22] Filed: May 25, 1983
[30] Foreign Application Priority Data May 28, 1982 [JP] Japan .................................. 57-90611
May 28, 1982 [JP] Japan .................................. 57-90612

[51] Int. Cl.[4] ............................................ H01L 27/02
[52] U.S. Cl. .......................................... 357/51; 357/59
[58] Field of Search ..................................... 357/51, 59

[56] References Cited
FOREIGN PATENT DOCUMENTS 0061056 5/1980 Japan ................................ 357/59 R Primary Examiner—Andrew J. James
Assistant Examiner—Mark Prenty
Attorney, Agent, or Firm—Laff, Whitesel, Conte & Saret

[57] ABSTRACT

A semiconductor device has a first insulating film formed on a semiconductor substrate. A first group of parallel first unit resistor elements are made of a first layer of polycrystalline silicon and formed on and attached to the first insulating film. A second insulating film is formed over the first unit resistor elements and the surface of the first insulating film which is between the first unit resistor elements. A second group of parallel second unit resistor elements are made of a second layer of polycrystalline silicon which are formed on the second insulating film. Each of the resistor elements in both groups is formed with contact portions at opposite ends thereof. A plurality of groups of wiring layers provide connections between (1) the contact portions at one end of the first unit resistor elements, (2) the contact portions at one end of the second unit resistor elements, (3) between the contact portions at the other ends of the first unit resistor elements, and (4) the contact portions at the other ends of the second unit resistor elements, respectively. A first input/output conductor is connected to the contact portion of one unit resistor element, and a second input/output conductor is connected to the contact portion of another unit resistor element, both being selected from among the first and second groups of unit resistor elements whereby they are formed into a single resistor.

9 Claims, 8 Drawing Figures

SEMICONDUCTOR DEVICE WITH A RESISTOR OF POLYCRYSTALLINE SILICON

BACKGROUND OF THE INVENTION

The present invention relates to a semiconductor device which is equipped with a resistor of polycrystalline silicon.

In recent years, it has become necessary to form a resistor of high resistance value, with a high degree of integration. In the technical field of the analog-to-digital signal conversion, for example, a CR filter which has a resistor of high resistance value is sometimes used for increasing the time constant of the filter. In this case, when the resistor is formed in a semiconductor substrate with an impurity region, its coefficient of voltage vs. resistance becomes large. Moreover, the frequency characteristics has large fluctuations because there is a large capacitance due to the PN junction between the impurity region of the resistor and the substrate. On the other hand, when the high resistance resistor is made of a polycrystalline film on the semiconductor substrate, the impurity concentration in the polycrystalline film must be restricted within a very small quantity to realize the high resistance value. Therefore, in this case, the sheet resistance of such a resistor varies widely according to the fabrication conditions. The controllability of the CR time constant is restricted as a matter of course.

It is, therefore, sufficient to make the resistor of polycrystalline silicon. The quantity of impurity introduced into the silicon is increased to an extent that it does not vary much with the fabrication conditions, and does not increase the total length of the resistor so that a desired resistance may be obtained. In this case, however, a large resistor-forming area is required on the semiconductor substrate so that a highly or densely integrated semiconductor device cannot be realized.

In the semiconductor device of the prior art, more specifically, a plurality of unit resistor elements are made in a single step, from a layer of polycrystalline silicon. The resistors are arranged parallel to one another over an insulating film overlying a semiconductor substrate. Their end portions are connected together by means of a metal film to provide a single resistor. Or, a single polycrystalline silicon layer is formed with a plurality of bends over the insulating film such that longer portions thereof extend parallel to one another to provide a resistor.

In a single patterning step in the etching process, i.e., in the photo-resist (PR) step, however, the spacing required between adjacent unit resistor elements or between the parallel longer portions is at least, for example, 2 to 5 μm. This spacing is determined not only by the material and fabrication accuracy of the mask, the thickness of the photo-resist, the exposure conditions, the thickness of the polycrystalline silicon layer and so on, but also by the whiskers which could form from one polycrystalline silicon pattern to an adjoining polycrystalline silicon pattern, namely, fine projections of polycrystalline silicon that may be undesirably formed by one PR step. If one of these fine projections comes into contact with the adjoining polycrystalline silicon pattern, a short-circuiting will naturally take place, to vary the resistance. This makes it necessary to enlarge the spacing.

Thus, the prior art has failed to provide a highly or densely integrated semiconductor device because of that limit in the spacing.

SUMMARY OF THE INVENTION

It is, therefore, an object of the present invention to provide a semiconductor device in which a resistor of polycrystalline silicon is arranged with a high degree of integration.

According to one feature of the present invention, a semiconductor device comprises a first insulating film formed on a semiconductor substrate. A first group of first unit resistor elements are made of a first layer of polycrystalline silicon formed on and attached to the first insulating film and arranged in parallel with each other. Each of the first unit resistor elements is formed with contact portions at both ends thereof. A second insulating film is formed over the first unit resistor elements and the surface of the first insulating film between the first unit resistor elements. A second group of second unit resistor elements is made of a second layer of polycrystalline silicon formed on the second insulating film and arranged in parallel to the first unit resistor elements. Each of the second unit resistor elements is formed with contact portions at both ends thereof. A plurality of groups of wiring layers provide connections between the contact portions at one end of each of the first unit resistor elements and the contact portions at one end of the corresponding second unit resistor elements, and between the contact portions at the other ends of the first unit resistor elements and the contact portions at the other ends of the second unit resistor elements, respectively. A first input/output conductor is connected to the contact portion of one unit resistor element selected from the first and second groups of unit resistor elements. A second input/output conductor is connected to the contact portion of another unit resistor element selected from the first and second groups of unit resistor elements whereby the first and second groups of unit resistor elements are formed into a single resistor. Each of the first unit resistor elements and each of the second unit resistor elements may be alternately arrayed, when viewed in plan view. Generally, each of the unit resistor elements of the first and second groups has a length of 15 to 200 μm, excluding the contact portions thereof, and a sheet resistance of 5 to 400 Ω/□.

The first resistor elements may be formed, in plan view, in a meandering shape which is composed of a plurality of straight and longer portions. A plurality of straight and shorter portions are connected to the ends of the longer side portions to connect the adjacent ends of said longer portions. The second resistor elements also may be formed, when viewed in plan view, in a meandering shape which is composed of a plurality of straight and longer portions arranged in parallel with the longer portions of the first resistor element. Each of the longer portions of the first resistor element is next to each of the longer portions of the second resistor element so that they are alternately arranged, when viewed in plan view. A plurality of straight shorter portions are connected to the ends of the longer portions to connect the adjacent ends of the longer side portions, thus forming a continuous resistor.

The first and second contact portions may be provided in the ends of first and second longer portions, selected from among the plurality of longer portions of the first resistor element. Also, the third and fourth contact portions may be provided in the ends of first and second longer portions selected from among the plurality of longer portions of the second resistor element.

According to another feature of the present invention, a semiconductor device comprises a first insulating film formed on a semiconductor substrate. A first resistor is made of a first layer of polycrystalline silicon formed on the first insulating film. A second insulating film covers the surface of the first resistor and the surface portion of the first insulating film where the first resistor is not provided. A second resistor is made of a second silicon formed on the second insulating film. A wiring connects the first and second resistors, whereby the first and second resistors are formed into a single resistor.

In the featured semiconductor devices, the second insulating film is preferably formed by a thermally oxidizing method, after patterning the first polycrystalline layer on the first insulating film to make either the first unit resistor elements or the first resistor element of a meandering shape. The second insulating film may be formed by a chemical vapor deposition (CVD) method after patterning the first polycrystalline layer. The sheet resistances of the first and second unit resistor elements, or of the first and second resistor elements may be different values, or may be substantially the same value.

According to another aspect of the present invention, a method of manufacturing a semiconductor device comprises the steps of forming a first polycrystalline silicon layer on a first insulating film on a major surface of a semiconductor substrate. The first polycrystalline silicon layer is selectively etched to shape a first resistor such as, for example, a plurality of first unit resistor elements or a first resistor element of meandering plan shape. A second insulating film is formed on the surface of the first resistor and on a surface portion of the first insulating film which is not covered with the first resistor. A second polycrystalline silicon layer is formed on the second insulating film, and is selective etched to shape a second resistor such as, for example, a plurality of second unit resistor elements or a second resistor element of meandering plan shape. These resistors are connected electrically. For example, connections may be made between each of predetermined portions of the first unit resistor elements and each of predetermined portions of the second unit resistor elements, or a predetermined portion of the first resistor element of meandering shape and a predetermined portion of the second resistor element of meandering shape by conductor to form a single resistor. The second insulating film is preferably formed by a thermal oxidation process. Also, it may be formed by a chemical vapor deposition process.

Thus, the present invention provides a semiconductor device in which a polycrystalline silicon layer is made to have a multi-layered construction. A first resistor is made of a first polycrystalline silicon layer. A second resistor is made of a second polycrystalline silicon layer formed over or separated from the first resistor by an insulating film. The first and second resistors are connected to provide one resistor. As a result, the area of the resistor-forming region on the semiconductor substrate is reduced for a predetermined total length of a resistor to about one-half the length which the resistor would have if made of only a single polycrystalline silicon layer in accordance with the prior art. Thanks to this construction, moreover, when each of the polycrystalline silicon layers is being patterned, the spacing between the patterns can be increased so that the PR step can be facilitated. Also, even if a whisker is formed on the first polycrystalline silicon when it is patterned, it can be confined by a thermally oxidized film, by conducting a subsequent thermally oxidizing step, or by being covered with a CVD insulating film so that the first and second polycrystalline silicon layers will not be short-circuited.

DESCRIPTION OF THE PREFERRED EMBODIMENTS

First Embodiment

Figure 1A:
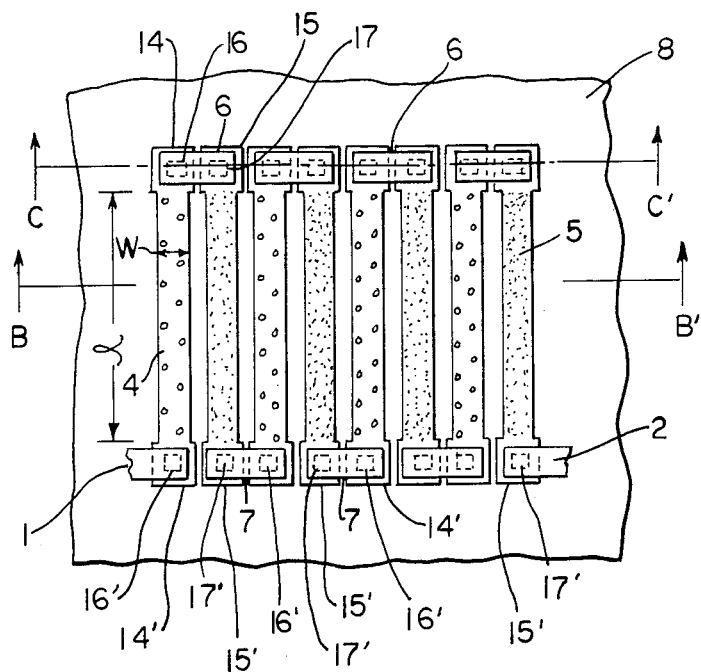
FIG. 1A is a plan view of a first embodiment of the present invention.
Figure 1B:
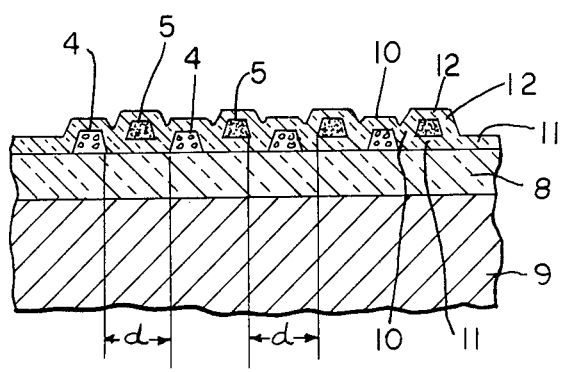
FIGS. 1B and 1C are cross sectional views taken along the lines B—B' and C—C' of FIG. 1A and viewed in the direction of arrows of FIG. 1A, respectively.
Figure 1C:
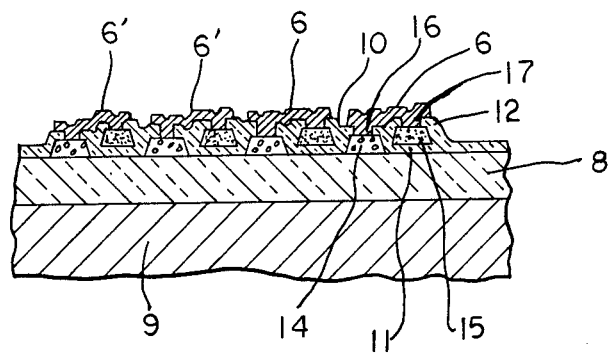

A first insulating film 8 has a thickness of about 1 μm and is formed by a thermal oxidizing process on a major surface of a semiconductor substrate 9. The substrate has element regions (not shown) therein. A first polycrystalline silicon layer is formed over the field oxide film 8. By an etching process, four first unit resistor elements 4 are formed, each having contact portions 14 and 14' of 7 μm×7 μm at both ends, the elements 4 being arranged parallel to one another. The first unit resistors elements 4 have a length of 50 μm, a width w of 5 μm, a thickness of 5,000 Å, and a sheet resistance of 40 Ω/□. The resistance between the two contacts, i.e., the resistance of each of the first unit resistor elements, is 440 Ω. In FIGS. 1A, 1B, 1C, the first polycrystalline silicon layer is indicated by a plurality of small circles.

The spacing d (FIG. 1B) between the first unit resistor elements 4 is 11 μm, which is sufficient for formation by current PR techniques. The upper surfaces, side surfaces and contact portions of the first unit resistor elements 4 are covered with a thermally oxidized film 10 which is obtained by thermally oxidizing the first polycrystalline silicon layer after the patterning thereof. The contact portions appear at both ends of each resistor element 4. This thermally oxidizing process also grows a thermally oxidized film 11 having a thickness of about 1,000 Å. Film 11 is above the parts of the first insulating film 8 which are not covered by the first polycrystalline silicon layer. Therefore, the second insulating film of this embodiment comprises the oxidized film 10 and the oxidized film 11. Then, the portions of the field insulating layer between the unit resistor elements 4 is composed of the first insulating film 8 and the film 11 of the second insulating film. The combined insulation between elements 4 is thicker than the thickness of the field insulating layer under the unit resistor elements 4, which is composed of only the first insulating film 8.

Next, a second polycrystalline silicon layer is formed over the oxidized film 10 and the oxidized film 11 of the second insulating film. By using the conventional etching process, four second unit resistor elements 5 with contact portions 15 and 15' at both ends thereof are made by the second layer of polycrystalline silicon. Second elements 5 are formed between the first unit resistor elements 4 and their contact portions. Each second unit resistor element 5, with its contact portions 15, has a plan shape and thickness which is the same as the shape and thickness of each first unit resistor element 4 and its contact portions 14, but the second unit resistor element have a sheet resistance of 20 Ω/□. As a result, the second unit resistor element have a resistance of 220 Ω. The second unit resistor elements 5 can be shaped easily because their spacing d is also 11 μm.

In FIGS. 1A, 1B, 1C, the second unit resistor elements and their contact portions are indicated by dots. Next, a thermally oxidized film 12, obtained by thermally oxidizing the second polycrystalline silicon layer, is formed to cover both the upper and side surfaces of the second unit resistor elements 5 and their contact portions 15 and 15'. Each of the contact portions 14 is connected to the adjacent contact portion 15 through contact holes 16 and 17 formed in the insulating film. These contact holes have a square shape of 5 μm × 5 μm and the connection is by means of a first wiring layer 6 of aluminum. In the present embodiment, as shown in FIG. 1A, four first wiring layers 6 are required. Likewise, each of the contact portions 14' is connected to the adjacent contact portion 15' through contact holes 16' and 17', also formed in the insulating film and having a square shape of 5 μm × 5 μm, respectively. This connection is completed by means of three second wiring layers 7 of aluminum. The contact portion 14' of the first unit resistor element 4 (at the left hand end of FIG. 1A) is connected through the contact holes 16' to a first input/output conductor 1 which is made of a layer of aluminum. The contact portions of the second unit resistor element 5 at the right hand end is connected through the contact hole 17' to a second input/output conductor 2 which is made of a layer of aluminum.

The single resistor is thus composed of the group of four first unit resistor elements 4 and the group of four second unit resistor elements 5, with a total resistance of 2,640 Ω.

The first and second unit resistors generally have a sheet resistance of 5 to 400 Ω/□ and a length l of 15 to 200 μm.

Thus, according to the present invention, the total resistance length required can be obtained in an area which is about one-half as large as the area required by a prior art resistor. The second unit resistor elements are made of a second layer of polycrystalline silicon and are interposed between the first unit resistor elements made of a first polycrystalline silicon layer. This makes it possible to provide a highly integrated semiconductor device. Thanks to the construction thus described, moreover, the polycrystalline silicon layers do not need to be elaborately patterned with a close spacing so that the resultant reliability can be increased.

In the present embodiment, the first and second unit resistor elements, with their contact portions, are made to have the same plan shapes, as has been described before, but they may have different plan shapes. Moreover, the numbers of resistors can be selected as dictated by design requirements. The sheet resistances of the first and second unit resistor elements could also be made substantially equal to each other. Furthermore, the impurities incorporated into each of the polycrystalline silicon layers may be introduced either during the CVD growth process or after the layers have been placed on the semiconductor substrate or after the patterning process of these layers.

Second Embodiment

Figure 2A:
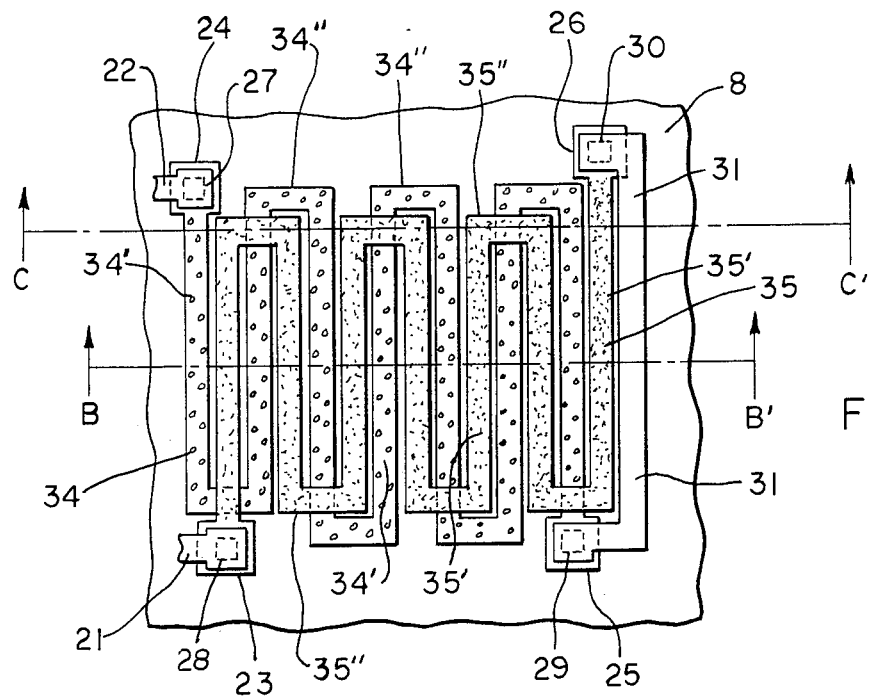
FIG. 2A is a plan view of a second embodiment of the present invention.
Figure 2B:
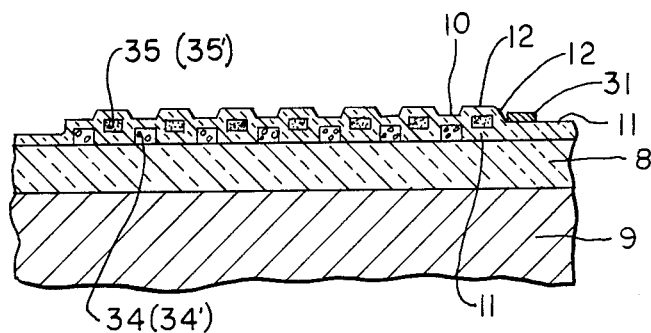
FIGS. 2B and 2C are cross sectional views taken along the lines B—B' and C—C' of FIG. 2A and viewed in the direction of arrows of FIG. 2A, respectively.
Figure 2C:
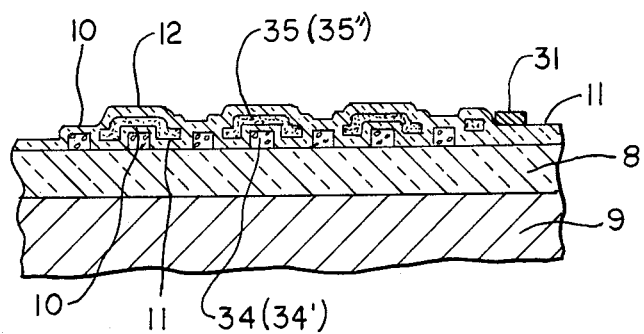

In FIG. 2 showing the second embodiment, those parts having the same functions as the parts of FIG. 1 are indicated by the same reference numerals. A first resistor element 34 has a meandering plan shape that is composed of a plurality of longer portions 34' having substantially a uniform width and a plurality of shorter portions 34" which are connected at both ends of each longer portion 34' to form a continuous resistor. The first and second contact portions 24 and 25 are formed by etching a first polycrystalline silicon layer. The first resistor element 34 is indicated by a plurality of small circles.

The first polycrystalline silicon layer is thermally oxidized after the patterning process, to cover the upper surface and the side surfaces of the first resistor element 34 and its contact portions with the insulating film 10 which is made from the first polycrystalline silicon layer. The thermally oxidized film 11 is grown on the first insulating film 8. After that, a second resistor element 35 is made by an etching process. Resistor 35 has a meandering shape that is composed of a plurality of longer portions 35' having substantially uniform width and a plurality of shorter portions 35" connected to both ends of each longer portion 35' to form a continuous element. Third and fourth contact portions 23 and 26 thereof are formed by providing the second polycrystalline silicon layer and by patterning it by an etching prcess. The second resistor element 35 is indicated by dots. The upper and side surfaces of the second resistor element 35 and the contact portions 23 and 26 are covered with the thermally oxidized film 12, which is obtained by thermally oxidizing the second polycrystalline silicon layer.

As can be seen in FIG. 2A, the longer portions 35' of the second resistor element 35 extend between the longer side portions 34' of the first resistor element 34, and the shorter portions 35" of the second resistor element 35 extend across parts of the longer portions 34' of the first resistor 34, the crossing being over the thermally oxidized film 10. The second contact portion 25 is connected to one end of the first resistor 34 and the fourt contact portion 26 is connected to one end of the second resistor 35 through contact holes 29 and 30 formed in the insulating film, respectively. The connections are made by means of a wiring layer 31 made of a layer of aluminum. Similarly, a first input/output conductor 22 is made of a layer of aluminum connected to the first contact portion 24 of the first resistor 34, through contact hole 27 formed in the insulating film. Whereas, a second input/output conductor 21 is made of a layer of aluminum connected through contact hole 28 formed in the insulating film to the third contact portion 23 of the second resistor element 35.

The present embodiment is also constructed so that each of the longer portions of the second resistor element is formed between two of the longer portions of the first resistor element. The complete resistor made of the first and second resistor elements can be formed within an area half as large as the area required for a prior art resistor. This makes it possible to provide a highly integrated semiconductor device.

In the drawing of the present embodiment, those parts of the first and second polycrystalline silicon resistor elements which overlap each other through the oxide film 10 are positioned in the vicinity of lead-out conductor 21. The second embodiment of the present invention can find a suitable application when used within a relatively low frequency range. This is because a capacitor is formed between the first and second polycrystalline silicon resistor elements, through the oxide film 10.

Third Embodiment

Figure 3:
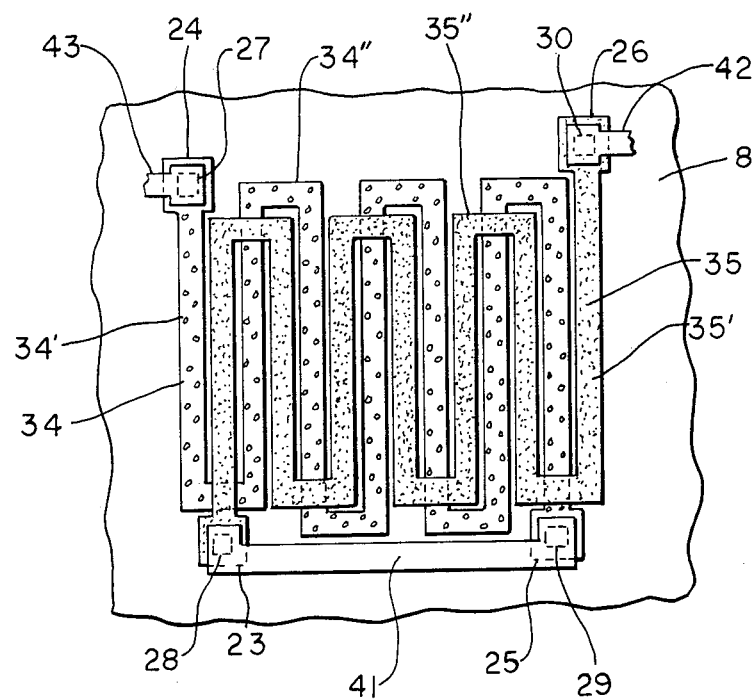
FIG. 3 is a plan view of a third embodiment of the present invention.

In FIG. 3, showing the third embodiment, those parts having the same functions as the corresponding parts of FIG. 2 are indicated by the same reference numerals.

The third embodiment has the layout shown in FIG. 3, in that the second contact portion 25 of the first resistor element 34 and the third contact portion 23 of the second resistor element 35 are connected through the contact holes 29 and 28 formed in the insulating film, the connection being completed by means of a wiring layer 41. A first input/output conductor 43 is connected through contact hole 27 formed in the insulating film to the first contact portion 24 of the first resistor element 34. A second input/output conductor 42 is connected through the contact hole formed in the insulating film to the fourth contact 26 of the second resistor 35. Because of these connections, the capacitances by the first and second polycrystalline silicon resistor elements, through the oxide film 10, are at an equal spacing from the lead-out conductors 42 and 43, respectively. The present embodiment can be suitably applied to a higher-frequency range than the second embodiment.

In the second and third embodiments, the number of the meanders of the first and second polycrystalline silicon resistor elements is seven, as has been described before. However, the practice of the present invention does not reside in the number of meanders, but does reside in the formation of longer portions of the first and second polycrystalline silicon resistor elements adjacent to each other.

Fourth Embodiment

Figure 4:
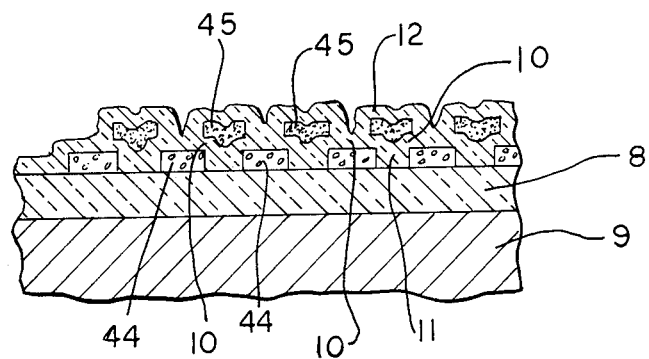
FIG. 4 is a cross sectional view of a fourth embodiment of the present invention.

In FIG. 4, those parts having the same functions as corresponding parts of FIGS. 1 and 2 are indicated by the same reference numerals.

In the first embodiment, each of the second unit resistor elements is formed in plan view so that it extends wholly between two of the first unit resistor elements. In the second and third embodiments, moreover, the longer portions of the second resistor element extend wholly in the widthwise direction between two longer portions of the first resistor element, as seen in the plan views. However, those shapes need not always be adopted. Second resistors elements 45 or longer portions 45 of the second resistor element could have their widthwise end parts formed to overlie the widthwise end parts of first resistor elements 44 or longer portion 44 of the first resistor element, the overlap being separated by the insulating film 10, as shown in FIG. 4 corresponding to FIGS. 1B and 2B.

Those who are skilled in the art will readily perceive how to modify the invention. Therefore, the appended claims are to be construed to cover all equivalent structures which fall within the true scope and spirit of the invention.

What is claimed is:

1. A semiconductor device comprising a first insulating film formed on a semiconductor substrate; a first group of first unit resistor elements made of a first layer of polycrystalline silicon formed on and attached to said first insulating film, the first unit resistor elements being arranged in parallel with each other and extending in one direction, each of said first unit resistor elements being formed with contact portions at opposite ends thereof; a second insulating film formed over said first unit resistor elements and over the surface of said first insulating film between said first unit resistor elements; a second group of said unit resistor elements made of a second layer of polycrystalline silicon formed on said second insulating film, said second unit resistor elements being arranged in parallel with said first unit resistor elements, each of said second unit resistor elements being formed with contact portions at opposite ends thereof; said first unit resistor elements and said second unit resistor elements being alternately arranged, each of said second unit resistor elements being entirely separated from the adjacent first unit resistor element with a predetermined minimum distance between them when viewed in plan view so that no portion of said second unit resistor elements overlies said first unit resistor elements; a plurality of groups of wiring layers for providing connections between said contact portions at one ends of said first unit resistor elements and said contact portions at corresponding ends of said second unit resistor elements, and between said contact portions at the other ends of said first unit resistor elements and the contact portions at the corresponding other ends of said second unit resistor elements, respectively; a first input/output conductor connected to said contact portion of one unit resistor element selected from among said first and second groups of unit resistor elements; and a second input/output conductor connected to said contact portion of another unit resistor element selected from among said first and second groups of unit resistor elements, whereby said first and second groups of unit resistor elements are formed into a single resistor.

2. A semiconductor device according to claim 1, wherein each of said first unit resistor elements and each of said second unit resistor elements are alternately arrayed, as viewed in plan view.

3. A semiconductor device according to claim 1, wherein said first unit resistor element and said second unit resistor element extend at a predetermined spacing, as viewed in plan view.

4. A semiconductor device according to claim 1, wherein said second insulating film is a thermally oxidized film.

5. A semiconductor device according to claim 1, wherein said second insulating film is a chemical vapour deposition.

6. A semiconductor device according to claim 1, wherein said first and second unit resistor elements have different sheet resistances.

7. A semiconductor device according to claim 1, wherein said first and second unit resistor elements have substantially the same sheet resistance.

8. A semiconductor device according to claim 1, wherein said second unit resistor elements are positioned at a lever which is higher from the surface of said semiconductor substrate than said first unit resistor elements are positioned.

9. A semiconductor device according to claim 1, wherein each of said unit resistor elements has a length of approximately 15 to 200 $\mu$m, excluding the contact portions thereof, and a sheet resistance of 5 to 400 $\Omega/\square$.

* * * * *